United States Patent
Takenaka

(10) Patent No.: US 7,692,318 B2
(45) Date of Patent: Apr. 6, 2010

(54) LIQUID EPOXY RESIN COMPOSITION AND SEMICONDUCTOR DEVICE

(75) Inventor: Hiroyuki Takenaka, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 270 days.

(21) Appl. No.: 11/386,776

(22) Filed: Mar. 23, 2006

(65) Prior Publication Data

US 2006/0217499 A1    Sep. 28, 2006

(30) Foreign Application Priority Data

Mar. 25, 2005    (JP)    ............... 2005-087669

(51) Int. Cl.
- H01L 23/29    (2006.01)
- C08L 63/00    (2006.01)
- B32B 27/04    (2006.01)
- B32B 27/18    (2006.01)
- B32B 27/20    (2006.01)
- B32B 27/26    (2006.01)
- B32B 27/38    (2006.01)

(52) U.S. Cl. .................. 257/793; 257/788; 257/789; 257/795; 428/413; 523/440; 525/523

(58) Field of Classification Search ........................ None
See application file for complete search history.

(56) References Cited

U.S. PATENT DOCUMENTS

| | | | | |
|---|---|---|---|---|
| 3,963,796 A | * | 6/1976 | Yokono et al. | ............... 525/524 |
| 4,503,161 A | * | 3/1985 | Korbel et al. | ............... 502/159 |
| 5,352,308 A | * | 10/1994 | Tomihara et al. | ............... 156/66 |
| 6,632,881 B1 | * | 10/2003 | Tsuchida et al. | ............... 525/65 |
| 6,674,016 B2 | * | 1/2004 | Kubo et al. | ................. 174/260 |
| 2003/0069349 A1 | * | 4/2003 | Sumita et al. | ............... 524/588 |

FOREIGN PATENT DOCUMENTS

| | | |
|---|---|---|
| JP | 9-176287 A | 7/1997 |
| JP | 9-176294 A | 7/1997 |

* cited by examiner

Primary Examiner—Michael J Feely
(74) Attorney, Agent, or Firm—Birch, Stewart, Kolasch & Birch, LLP

(57) ABSTRACT

Better semiconductor encapsulation is achieved with a liquid epoxy resin composition comprising (A) a liquid epoxy resin, (B) a curing agent containing at least 5 wt % of an aromatic amine compound, (C) a microencapsulated catalyst containing a phenolic hydroxy-bearing benzoic acid derivative, and optionally, (D) an inorganic filler.

10 Claims, 1 Drawing Sheet

LIQUID EPOXY RESIN COMPOSITION AND SEMICONDUCTOR DEVICE

CROSS-REFERENCE TO RELATED APPLICATION

This non-provisional application claims priority under 35 U.S.C. §119(a) on Patent Application No. 2005-087669 filed in Japan on Mar. 25, 2005, the entire contents of which are hereby incorporated by reference.

FIELD OF THE INVENTION

This invention relates to a liquid epoxy resin composition for the encapsulation of semiconductors, and more particularly, to a liquid epoxy resin composition which cures into a product having improved adhesion to the surface of silicon chips and especially photosensitive polyimide resins, nitride films and oxide films, improved resistance to humidity and to thermal shocks at high temperatures above the reflow temperature of 260° C., and is thus suitable as encapsulation material. It also relates to a semiconductor device which is encapsulated with the liquid epoxy resin composition in the cured state.

BACKGROUND OF THE INVENTION

The trend toward smaller sizes, lighter weights and increased capabilities in electrical equipment has brought a shift in the dominant semiconductor mount technology from pin insertion to surface mounting. Progress of semiconductor devices toward a higher degree of integration entails the enlargement of dies to a size as large as 10 mm or more per side. For semiconductor devices using such large size dies, greater stresses are applied to the die and the encapsulant during solder reflow. Such stresses are problematic because separation occurs at the interface between the encapsulant and the die or substrate, and the package cracks upon substrate mounting.

From the expectation that the use of leaded solders will be banned in the near future, a number of lead-substitute solders have been developed. Since most substitute solders have a higher melting temperature than the leaded solders, it has been considered to carry out reflow at temperatures of 260 to 270° C. At higher reflow temperatures, more failures are expected with encapsulants of prior art liquid epoxy resin compositions. Even with flip chip type packages which have raised no substantial problems in the prior art, the reflow at such high temperatures brings about serious problems that cracks can occur during the reflow and the encapsulant can peel at interfaces with chips or substrates.

These requirements are met by liquid encapsulating resins comprising liquid epoxy resin and alkyl-substituted aromatic diamine as disclosed in JP-A 9-176287 and JP-A 9-176294. These materials are fully adherent to substrates, metals and solder resists, exhibit good reflow resistance and thermal cycling crack resistance, and enable highly reliable packages.

However, the above resin compositions require a long time for curing, typically 3 hours at 150° C., which is undesired for efficient package manufacture. A long gel time that allows the filler to settle down and eventually, surface cracks to occur, and a short pot life are also problems. Cure accelerators like phenols and phenolic acids such as salicylic acid are considered effective for reducing the curing time, but have drawbacks including a short pot life and significantly inefficient working.

DISCLOSURE OF THE INVENTION

An object of the invention is to provide a liquid epoxy resin composition for semiconductor device encapsulation which cures relatively fast as compared with the prior art, forms a cured product that has improved adhesion to the surface of silicon chips and especially photosensitive polyimide resins and nitride films and improved toughness, does not suffer a failure even when the reflow temperature elevates from the conventional temperature of nearly 240° C. to 260-270° C., does not deteriorate under hot humid conditions as encountered in a pressure cooker test (PCT) at 120° C./2.1 atm, and does not peel or crack over several hundred cycles of thermal cycling between −65° C. and 150° C. Another object of the invention is to provide a semiconductor device which is encapsulated with a cured product of the liquid epoxy resin composition.

The inventor has found that better results of semiconductor encapsulation are obtained from a liquid epoxy resin composition comprising (A) a liquid epoxy resin, (B) an aromatic amine curing agent, especially an aromatic amine curing agent containing at least 5% by weight of an aromatic amine compound having the general formula (1), (C) microcapsules containing a phenolic hydroxy-bearing benzoic acid derivative having the general formula (2), and optionally, (D) an inorganic filler. The liquid epoxy resin composition is low viscous and easy to work, effectively adherent to the surface of silicon chips and inter alia, photosensitive polyimide resins and nitride films, especially nitride films, does not deteriorate under hot humid conditions as encountered in PCT at 120° C./2.1 atm, and is fully resistant to thermal shocks. The composition is thus suited as an encapsulant for large die size semiconductor devices.

In a liquid epoxy resin composition, the aromatic amine compound of formula (1), by virtue of unique substituent groups included therein, invites relatively fast heat cure, but ensures a long pot-life and imparts improved mechanical, electrical, heat resistant and chemical resistant properties to cured parts, as compared with conventional aromatic amine curing agents. The liquid epoxy resin composition comprising the aromatic amine compound of formula (1) becomes effectively adherent to the surface of silicon chips and inter alia, photosensitive polyimide resins and nitride films, is drastically improved in thermal shock resistance, and maintains satisfactory properties even under hot humid conditions. Moreover, if the aromatic amine curing agent of formula (2) is used, the aromatic amine curing agent has a low viscosity so that the resulting composition can be reduced in viscosity, indicating substantial improvements in working and molding. The invention is predicated on these findings.

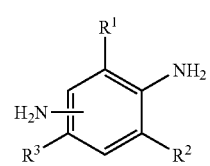
(1)

Herein $R^1$, $R^2$ and $R^3$ are each independently selected from among monovalent $C_1$-$C_6$ hydrocarbon groups, $CH_3S$— and $C_2H_5S$—.

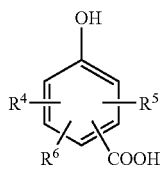

(2)

Herein $R^4$, $R^5$ and $R^6$ are each independently selected from among hydrogen, hydroxyl, $C_1$-$C_{10}$ alkoxy, and substituted or unsubstituted monovalent $C_1$-$C_{12}$ hydrocarbon groups which may be separated by at least one atom selected from oxygen, nitrogen, sulfur and silicon.

Accordingly, the present invention provides a liquid epoxy resin composition comprising
(A) a liquid epoxy resin,
(B) an aromatic amine curing agent, preferably an aromatic amine curing agent containing at least 5% by weight of an aromatic amine compound having the general formula (1), and
(C) microcapsules containing a phenolic hydroxy-bearing benzoic acid derivative having the general formula (2).

In a preferred embodiment, the microcapsules containing a phenolic hydroxy-bearing benzoic acid derivative (C) is present in an amount of 0.1 to 50 parts by weight per 100 parts by weight of components (A) and (B) combined.

In a preferred embodiment, the phenolic hydroxy-bearing benzoic acid derivative having the general formula (2) is selected from among salicylic acid, 3-hydroxybenzoic acid, 4-hydroxybenzoic acid, 3-methylsalicylic acid, 4-methylsalicylic acid, 5-methylsalicylic acid, 3,5-di-t-butyl-4-hydroxybenzoic acid, 2,3-dihydroxybenzoic acid, 2,4-dihydroxybenzoic acid, 2,5-dihydroxybenzoic acid, 2,6-dihydroxybenzoic acid, and octyl-4-hydroxybenzoic acid.

In a preferred embodiment, the microcapsules (C) have an average particle size of 0.5 to 10 μm, and an amount of the phenolic hydroxy-bearing benzoic acid derivative leached out from the microcapsules with cresol at 30° C. for 15 minutes is at least 70% by weight of the total content of the phenolic hydroxy-bearing benzoic acid derivative in the microcapsules.

In a preferred embodiment, the composition is used as a potting material and further comprises (D) an inorganic filler having an average particle size of 2 to 20 μm and a maximum particle size of up to 75 μm in an amount of 50 to 1,200 parts by weight per 100 parts by weight of the epoxy resin (A) and the aromatic amine curing agent (B) combined.

In a preferred embodiment, the composition is used as an underfill and further comprises (D) an inorganic filler having an average particle size at most about one-tenth as large and a maximum particle size at most one-half as large as the size of a flip chip gas (between a substrate and semiconductor chip in a flip chip semiconductor device) in an amount of 50 to 400 parts by weight per 100 parts by weight of the epoxy resin (A) and the aromatic amine curing agent (B) combined.

Also contemplated herein is a semiconductor device which is encapsulated with the liquid epoxy resin composition in the cured state. Another embodiment is a flip chip type semiconductor device which is encapsulated with the liquid epoxy resin composition in the cured state as an underfill.

BENEFITS OF THE INVENTION

The liquid epoxy resin composition of the invention is reduced in curing time while maintaining shelf stability. The composition cures into a part that is effectively adherent to the surface of silicon chips and inter alia, photosensitive polyimide resins and nitride films. Then the semiconductor device encapsulated with the composition does not suffer a failure even when the reflow temperature elevates from the conventional temperature of nearly 240° C. to 260-270° C., does not deteriorate under hot humid conditions as encountered in PCT at 120° C./2.1 atm, and does not peel or crack over several hundred cycles of thermal cycling between −65° C. and 150° C.

BRIEF DESCRIPTION OF THE DRAWING

The only FIGURE.

DESCRIPTION OF THE PREFERRED EMBODIMENTS

Figure 1:
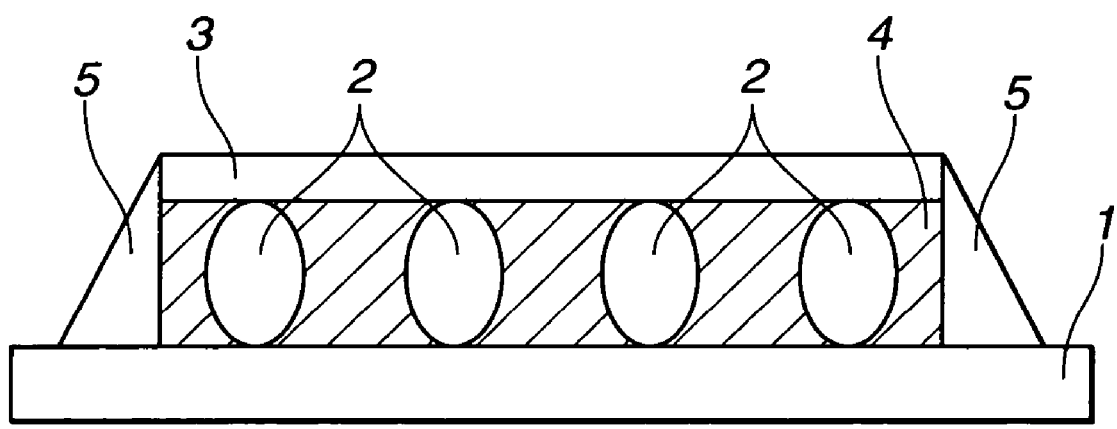
FIG. 1 is a schematic view of a flip chip type semiconductor device according to one embodiment of the invention.

The notation (Cn-Cm) means a group containing from n to m carbon atoms per group.

(A) Epoxy Resin

In the liquid epoxy resin composition of the invention, any epoxy resin may be used as the liquid epoxy resin (A) as long as it contains three or less epoxy functional groups in a molecule and is liquid at normal temperature. Preferably the liquid epoxy resin has a viscosity at 25° C. of up to 800 Pa·s, especially up to 500 Pa·s. Useful liquid epoxy resins include bisphenol type epoxy resins such as bisphenol A epoxy resins and bisphenol F epoxy resins, naphthalene type epoxy resins and phenyl glycidyl ethers. Of these, epoxy resins which are liquid at room temperature (25° C.) are desirable. The epoxy resins may be used alone or in admixture of two or more. It is noted throughout the specification that the viscosity is measured at 25° C. by a rotational viscometer.

The epoxy resin may comprise an epoxy resin of the structural formula (3) or (4) shown below insofar as infiltration ability is not compromised.

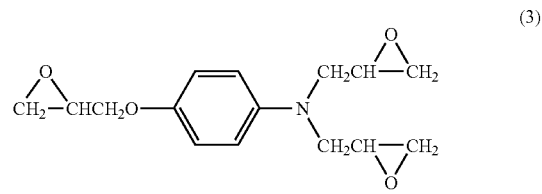

(3)

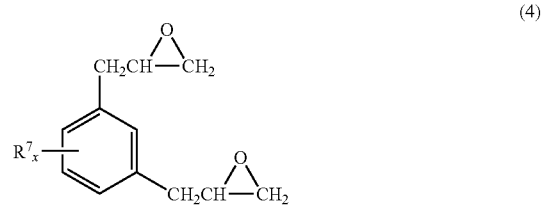

(4)

Herein, $R^7$ is hydrogen or a monovalent hydrocarbon group having 1 to 20 carbon atoms, preferably 1 to 10 carbon atoms, more preferably 1 to 3 carbon atoms. Exemplary of the monovalent hydrocarbon group are alkyl groups such as methyl, ethyl and propyl, and alkenyl groups such as vinyl and allyl. The subscript x is an integer of 1 to 4, especially 1 or 2.

It is recommended that the epoxy resin of formula (4), if compounded, be used in an amount of at least 25% by weight, preferably at least 50% by weight, more preferably at least 75% by weight based on the entire epoxy resins. If the content of the epoxy resin of formula (4) is less than 25 wt %, the composition may have an increased viscosity or the heat resistance of cured products may lower. The upper limit may be even 100% by weight.

The epoxy resin of formula (4) is commercially available, for example, under the trade name of RE600NM from Nippon Kayaku Co., Ltd.

The liquid epoxy resin preferably has a total chlorine content of not more than 1,500 ppm, and especially not more than 1,000 ppm. When chlorine is extracted from the epoxy resin with water at an epoxy resin concentration of 50% and a temperature of 100° C. over a period of 20 hours, the water-extracted chlorine level is preferably not more than 10 ppm. A total chlorine content of more than 1,500 ppm or a water-extracted chlorine level of more than 10 ppm may exacerbate the reliability of the encapsulated semiconductor device, particularly in the presence of moisture.

(B) Curing Agent

The aromatic amine curing agent (B) used herein is any conventional one. Preferably, component (B) contains at least 5% by weight, based on the entire curing agent, of an aromatic amine compound having the general formula (1).

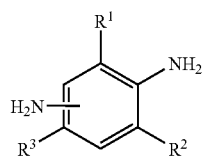

(1)

Herein $R^1$ to $R^3$ are independently selected from among a monovalent $C_1$-$C_6$ hydrocarbon group, $CH_3S$— and $C_2H_5S$—.

The monovalent hydrocarbon groups represented by $R^1$ to $R^3$ are preferably those having 1 to 6 carbon atoms, more preferably 1 to 3 carbon atoms, for example, alkyl groups such as methyl, ethyl, propyl, isopropyl, butyl, isobutyl, tert-butyl and hexyl, alkenyl groups such as vinyl, allyl, propenyl, butenyl and hexenyl, phenyl groups, and halo-substituted monovalent hydrocarbon groups in which some or all of the hydrogen atoms are substituted by halogen atoms (e.g., chlorine, fluorine and bromine), such as fluoromethyl, bromoethyl and trifluoropropyl.

Specific, non-limiting examples of the aromatic amine compound having formula (1) include diethyltoluenediamine, dimethylthiotoluenediamine, and dimethyltoluenediamine.

The aromatic amine curing agent (B) contains at least 5% by weight, preferably 10 to 100% by weight, more preferably 20 to 100% by weight, based on the entire curing agent, of the aromatic amine compound having formula (1). If the aromatic amine compound having formula (1) is less than 5% by weight of the entire curing agent, there arise problems like an increased viscosity, a reduced bond strength and cracks.

The curing agents other than the aromatic amine compound having formula (1) are preferably aromatic diaminodiphenylmethanes such as 3,3'-diethyl-4,4'-diaminophenylmethane, 3,3',5,5'-tetramethyl-4,4'-diaminophenylmethane, and 3,3',5,5'-tetraethyl-4,4'-diaminophenylmethane, and aromatic amines such as 2,4-diaminotoluene, 1,4-diaminobenzene and 1,3-diaminobenzene.

Among the aromatic amine curing agents, a curing agent which is liquid at normal temperature may be compounded directly. If an aromatic amine curing agent is solid at normal temperature, direct compounding of that aromatic amine curing agent with the epoxy resin results in a resin compound which has an increased viscosity and is awkward to work. It is then preferred to previously melt and mix the normally solid aromatic amine curing agent with the epoxy resin, more preferably in a predetermined proportion at a temperature in the range of 70 to 150° C. for 1 to 2 hours. At a mixing temperature below 70° C., the aromatic amine curing agent may be less miscible with the epoxy resin. A temperature above 150° C. can cause the aromatic amine curing agent to react with the epoxy resin to increase its viscosity. A mixing time of less than 1 hour is insufficient to achieve intimate mixing of the aromatic amine curing agent with the resin, inviting a viscosity increase. A time of more than 2 hours may allow the aromatic amine curing agent to react with the epoxy resin to increase its viscosity.

The total amount of the aromatic amine curing agent used herein should preferably be such that the ratio of the epoxy equivalent of the liquid epoxy resin to the amine equivalent of the aromatic amine curing agent, (A)/(B), is in the range from 0.7/1 to 1.2/1, more preferably from 0.7/1 to 1.1/1, even more preferably from 0.85/1 to 1.05/1. If the equivalent ratio of liquid epoxy resin to aromatic amine curing agent is less than 0.7, unreacted amino groups are left, probably resulting in a lower glass transition temperature and poor adhesion. With an equivalent ratio in excess of 1.2, there is a possibility that the cured product becomes hard and brittle enough for cracks to form during the reflow soldering.

(C) Curing Catalyst

Component (C) in the inventive epoxy resin composition is a microcapsule catalyst that serves as a curing agent for components (A) and (B). Microcapsules have confined therein a phenolic hydroxy-bearing benzoic acid derivative having the general formula (2).

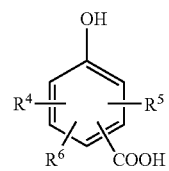

(2)

Herein $R^4$, $R^5$ and $R^6$ are each independently selected from among hydrogen, hydroxyl, $C_1$-$C_{10}$ alkoxy, and substituted or unsubstituted monovalent $C_1$-$C_{12}$ hydrocarbon groups which may be separated by at least one atom selected from oxygen, nitrogen, sulfur and silicon.

Suitable alkoxy groups represented by $R^4$ to $R^6$ include those of 1 to 10 carbon atoms, preferably 1 to 5 carbon atoms, for example, methoxy, ethoxy, propoxy, isopropoxy, butoxy, isobutoxy, and tert-butoxy groups. Suitable monovalent hydrocarbon groups represented by $R^4$ to $R^6$ include those of 1 to 12 carbon atoms, preferably 1 to 10 carbon atoms, which may be separated by at least one atom selected from oxygen, nitrogen, sulfur and silicon, for example, alkyl groups such as methyl, ethyl, propyl, isopropyl, butyl, isobutyl, tert-butyl, pentyl, neopentyl, hexyl, cyclohexyl, octyl, nonyl, and decyl, aryl groups such as phenyl, tolyl, xylyl, and naphthyl, aralkyl groups such as benzyl, phenylethyl, and phenylpropyl, alkenyl groups such as vinyl, allyl, propenyl, isopropenyl, butenyl, hexenyl, cyclohexenyl, and octenyl, dimethylaminomethyl, and substituted forms of the foregoing groups in which some or all hydrogen atoms are substituted by halogen atoms (e.g., fluoro, bromo, chloro), cyano groups, hydroxyl groups or the like, such as haloalkyl groups, e.g., chloromethyl, chloropropyl, bromoethyl, and trifluoropropyl, as well as cyanoethyl and hydroxyethyl.

Examples of the phenolic hydroxy-bearing benzoic acid derivative having formula (2) include salicylic acid, 3-hydroxybenzoic acid, 4-hydroxybenzoic acid, 3-methylsalicylic acid, 4-methylsalicylic acid, 5-methylsalicylic acid, 3,5-di-t-butyl-4-hydroxybenzoic acid, 2,3-dihydroxybenzoic acid, 2,4-dihydroxybenzoic acid, 2,5-dihydroxybenzoic acid, 2,6-dihydroxybenzoic acid, and octyl-4-hydroxybenzoic acid.

The microcapsules employed in the invention use as the shell material any of polymers composed of (meth)acrylic monomers such as $C_1$-$C_8$ alkyl esters of acrylic acid, methacrylic acid, itaconic acid or crotonic acid, or $C_1$-$C_8$ alkyl esters of the same type whose alkyl group is substituted with an allyl group or the like; monofunctional monomers such as styrene, α-methylstyrene, acrylonitrile, methacrylonitrile or vinyl acetate; and polyfunctional monomers such as ethylene glycol di(meth)acrylate, polyethylene glycol di(meth)acrylate, divinylbenzene, bisphenol A di(meth)acrylate and methylenebis(meth)acrylamide. The phenolic hydroxy-bearing benzoic acid derivative serving as the curing catalyst is enclosed within the polymer shell. Of the above polymers, polymers of (meth)acrylic monomers are preferred.

A variety of methods may be used to produce the microcapsules containing the phenolic hydroxy-bearing benzoic acid derivative. The use of a method known to the art, such as suspension polymerization or emulsion polymerization, is advantageous for the efficient production of microcapsules of good sphericity. For instance, JP-A 5-247179 discloses a process for producing microcapsules by enclosing a solid core material based on an amine as an epoxy resin curing agent using a radical polymerizable monomer including an organic acid having a polymerizable double bond.

To obtain a high-concentration microencapsulated catalyst using a curing catalyst of customary molecular structure, the above-described monomer is used in an overall amount of preferably about 10 to 200 parts by weight, more preferably 10 to 100 parts by weight, and most preferably 20 to 50 parts by weight, per 10 parts by weight of the curing catalyst. Less than 10 parts by weight of the monomer may be difficult for the microcapsule to impart sufficient latency to the curing catalyst. On the other hand, the use of more than 200 parts by weight of the monomer lowers the proportion of catalyst, which may make it necessary to use a large amount of microencapsulated catalyst to achieve sufficient curability and can therefore be economically undesirable. Differently stated, the concentration of the catalyst in the microcapsules is preferably about 5 to 50% by weight, more preferably about 10 to 50% by weight.

The microcapsules produced by the foregoing process preferably have an average particle size of 0.5 to 10 μm and a maximum particle size of not more than 50 μm, and more preferably an average particle size of 2 to 5 μm and a maximum particle size of not more than 20 μm. An average particle size of less than 0.5 μm corresponds to so large a specific surface area that the incorporation of such microcapsules in the composition may increase the viscosity thereof. On the other hand, microcapsules with an average particle size greater than 10 μm may be dispersed in the resin component non-uniformly, leading to a decline of reliability.

It is noted that the average particle size is determined as a weight average particle size $D_{50}$ (or median diameter), for example, on particle size distribution measurement by laser light diffraction analysis or the like. The maximum particle size is similarly determined by laser light diffraction analysis or the like.

The microcapsules containing the curing catalyst (phenolic hydroxyl-bearing benzoic acid derivative) preferably has a performance such that, when 1 g of the curing catalyst-containing microcapsules is measured out and mixed into 30 g of o-cresol, the mixture is left to stand at 30° C. for 15 minutes, and the amount of catalyst that has leached out of the microcapsules is determined by gas chromatography, catalyst leaching from the microcapsules into o-cresol corresponds to at least 70 wt % (i.e., 70 to 100 wt %) of the total amount of catalyst in the microcapsules. At a leaching of less than 70 wt %, a longer curing time may become necessary, leading to a drop of productivity. The preferred catalyst leaching is at least 75 wt %.

An appropriate amount of the microcapsules blended is 0.5 to 20 parts by weight, more preferably 1 to 15 parts by weight, per 100 parts by weight of components (A) and (B) combined. Less than 0.5 part of the microcapsules may be less effective for curing whereas more than 20 parts by weight may provide excellent cure at the sacrifice of shelf stability.

As the curing catalyst, a bare (or non-microencapsulated) catalyst, i.e., phenolic hydroxyl-bearing benzoic acid derivative itself may be used in admixture with the microencapsulated catalyst. In this embodiment, the amount of the catalyst within microcapsules and the bare catalyst combined is preferably 0.5 to 20 parts, especially 0.5 to 15 parts by weight per 100 parts by weight of components (A) and (B) combined. Less than 0.5 part by weight may be less effective for curing whereas more than 20 parts by weight may provide excellent cure at the sacrifice of shelf stability. The proportion of the bare catalyst added is preferably up to 1/10 of the total catalyst amount because more than 1/10 may provide excellent cure at the sacrifice of shelf stability.

(D) Inorganic Filler

In the inventive composition, (D) any well-known inorganic filler may be added for lowering a coefficient of thermal expansion. Specific examples include fused silica, crystalline silica, alumina, aluminum nitride, boron nitride, silicon nitride, magnesia and magnesium silicate. Of these, spherical fused silica is desirable for achieving low viscosity.

The inorganic filler used herein is preferably surface treated beforehand with a coupling agent such as a silane coupling agent or a titanate coupling agent in order to increase the bonding strength between the resin and the inorganic filler. The preferred coupling agents are silane coupling agents including epoxy silanes such as γ-glycidoxypropyltrimethoxysilane,
γ-glycidoxypropylmethyldiethoxysilane, and
β-(3,4-epoxycyclohexyl)ethyltrimethoxysilane;

amino silanes such as
N-β-(aminoethyl)-γ-aminopropyltrimethoxysilane,
γ-aminopropyltriethoxysilane, and
N-phenyl-γ-aminopropyltrimethoxysilane; and mercapto silanes such as γ-mercaptopropyltrimethoxysilane. No particular limitation is imposed on the amount of coupling agent used for surface treatment or the method of surface treatment.

In one embodiment wherein the inventive composition is used as a potting material, the inorganic filler preferably has an average particle size of 2 to 20 μm and a maximum particle size of up to 75 μm, more preferably up to 50 μm. At an average particle size of less than 2 μm, the composition loaded with such filler may have too high a viscosity, meaning that the loading of filler is limited. An average particle size of more than 20 μm indicates a larger number of coarse particles which can be caught by lead wire, leaving voids.

In this embodiment, the amount of inorganic filler (D) included in the composition is preferably in a range of 50 to 1,200 parts by weight, and more preferably 100 to 1,200 parts by weight, per 100 parts by weight of the epoxy resin (A) and the aromatic amine curing agent (B) combined. A composition with less than 50 parts by weight of the filler may have too large a coefficient of expansion and induce cracks in a thermal cycling test. A composition with more than 1,200 parts by weight of the filler may be increased in viscosity to such an extent as to reduce flow. It is noted that the inventive composition, when used as a potting material, should preferably have a viscosity of up to 700 Pa·s, more preferably up to 500 Pa·s at 25° C.

In another embodiment wherein the inventive composition is used as an underfill which should exhibit both improved penetration and a lower linear expansion, it is advantageous to include an inorganic filler having an average particle size at most about one-tenth as large and a maximum particle size at most one-half as large as the size of the flip chip gap (between the substrate and semiconductor chip in a flip chip semiconductor device).

In the other embodiment, the amount of inorganic filler (D) included in the composition is preferably in a range of 50 to 400 parts by weight, and more preferably 100 to 250 parts by weight, per 100 parts by weight of the epoxy resin (A) and the aromatic amine curing agent (B) combined. A composition with less than 50 parts by weight of the filler may have too large a coefficient of expansion and induce cracks in a thermal cycling test. A composition with more than 400 parts by weight of the filler may have an increased viscosity, which may bring about a decline in thin-film penetration. It is noted that the inventive composition, when used as an underfill, should preferably have a viscosity of up to 250 Pa·s, more preferably up to 100 Pa·s at 25° C.

Other Additives

In the liquid epoxy resin composition of the invention, silicone rubbers, silicone oils, liquid polybutadiene rubbers, and thermoplastic resins such as methyl methacrylate-butadiene-styrene copolymers may be included for the stress reduction purpose. The preferred stress reducing agent is a silicone-modified resin in the form of a copolymer which is obtained from an alkenyl group-containing epoxy resin or alkenyl group-containing phenolic resin and an organopolysiloxane of the average compositional formula (5) containing per molecule 20 to 400 silicon atoms and 1 to 5 hydrogen atoms each directly attached to a silicon atom (i.e., SiH groups), by effecting addition of SiH groups to alkenyl groups.

$$H_a R^8_b SiO_{(4-a-b)/2} \quad (5)$$

Herein $R^8$ is a substituted or unsubstituted monovalent hydrocarbon group, "a" is a number of 0.01 to 0.1, "b" is a number of 1.8 to 2.2, and the sum of a+b is from 1.81 to 2.3.

The monovalent hydrocarbon group represented by $R^8$ preferably has 1 to 10 carbons, and especially 1 to 8 carbons. Illustrative examples include alkyl groups such as methyl, ethyl, propyl, isopropyl, butyl, isobutyl, tert-butyl, hexyl, octyl and decyl; alkenyl groups such as vinyl, allyl, propenyl, butenyl and hexenyl; aryl groups such as phenyl, xylyl and tolyl; aralkyl groups such as benzyl, phenylethyl and phenylpropyl; and halo-substituted monovalent hydrocarbon groups in which halogen atoms (e.g., chloro, fluoro, bromo) substitute for some or all of the hydrogen atoms on the foregoing hydrocarbon groups, such as fluoromethyl, bromoethyl and trifluoropropyl.

Copolymers having the following structure (6) are preferred.

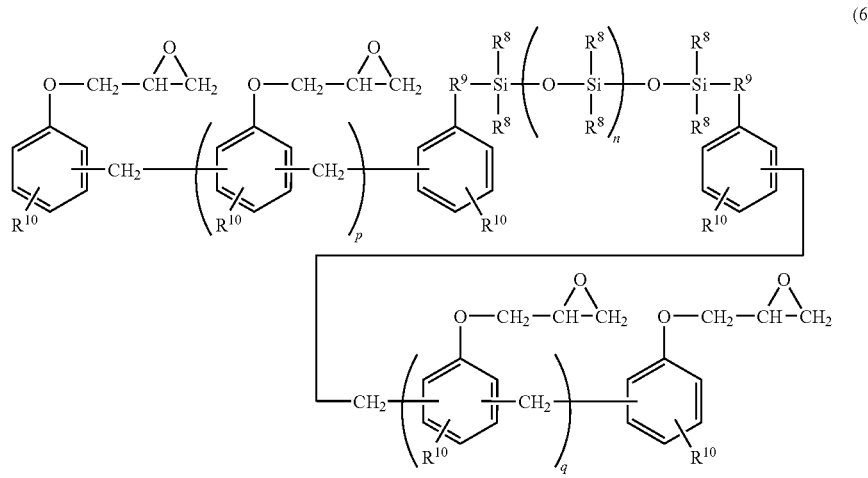

(6)

In formula (6), $R^8$ is as defined above, $R^9$ is —CH$_2$CH$_2$CH$_2$—, —OCH$_2$—CH(OH)—CH—O—CH$_2$CH$_2$CH$_2$—, or —O—CH$_2$CH$_2$CH$_2$—, and $R^{10}$ is a hydrogen atom or a $C_1$-$C_4$ alkyl group. The letter n is an integer from 4 to 199, and preferably from 19 to 109, p is an integer from 1 to 10, and q is an integer from 1 to 10.

The copolymer is included in the inventive composition such that the amount of diorganopolysiloxane units is 0 to 20 parts by weight, and preferably 2 to 15 parts by weight, per 100 parts by weight of components (A) and (B) combined, whereby stress can be further reduced. It is noted that the amount of diorganopolysiloxane is equal to [molecular weight of polysiloxane moiety]/[molecular weight of copolymer] multiplied by the addition amount (parts by weight).

If necessary, the liquid epoxy resin composition may further contain additives as long as they do not compromise the objects of the invention. Suitable additives include carbon-functional silanes for improving adhesion, pigments (e.g., carbon black), dyes, and antioxidants. It is recommended that the addition of an alkoxy-bearing silane coupling agent as the carbon functional silane adhesion improver is excluded from the present invention although such a coupling agent can be used as the surface treating agent for the filler. Particularly when the composition is used as an underfill, the alkoxy-bearing silane coupling agent, even in minor amounts, can cause voids.

Preparation

The liquid epoxy resin composition of the invention may be prepared by the simultaneous or sequential agitation, dissolution, mixing and dispersion of a liquid epoxy resin, an aromatic amine curing agent, microcapsules, optionally, an inorganic filler and other additives, while carrying out heat treatment if necessary. No particular limitation is imposed on the apparatus used for mixing, agitating, dispersing and otherwise processing the mixture of components. Exemplary apparatus suitable for this purpose include an automated mortar, three-roll mill, ball mill, and planetary mixer, coupled to agitator and heater units. Use can also be made of suitable combinations of these apparatuses.

When used as an encapsulant, the liquid epoxy resin composition should desirably have a viscosity at 25° C. of up to 1,000 Pa·s, and more desirably up to 500 Pa·s.

An ordinary molding method and ordinary molding conditions may be employed in shaping the inventive composition. It is preferable to carry out an initial hot oven cure at 100 to 120° C. for at least 0.5 hour, followed by a subsequent hot oven cure at 150 to 175° C. for at least 0.5 hour. A cure time of less than 0.5 hour during 100-120° C. heating may result in void formation after curing. A post-cure time of less than 0.5 hour during 150-175° C. heating may yield a cured product having less than sufficient properties. The cure time is determined as appropriate depending on the heating temperature.

The semiconductor devices to be encapsulated with the inventive composition are typically flip chip-type semiconductor devices. Referring to FIG. 1, the flip chip-type semiconductor device includes an organic substrate 1 having an interconnect pattern side on which is mounted a semiconductor chip 3 over a plurality of intervening bumps 2. The gap between the organic substrate 1 and the semiconductor chip 3 (shown in the diagram as gaps between the bumps 2) is filled with an underfill material 4, and the lateral edges of the gap and the periphery of semiconductor chip 3 are sealed with a fillet material 5. The inventive liquid epoxy resin composition is especially suitable in forming the underfill.

EXAMPLE

Examples of the invention and Comparative Examples are given below by way of illustration, and are not intended to limit the invention. The acronym Mw is molecular weight and pbw is parts by weight.

Examples 1-7, Comparative Examples 1-5 and Reference Examples 1-2

The components shown in Tables 1 and 2 were intimately kneaded on a planetary mixer and three-roll mill to give seven resin compositions. These resin compositions were examined by the following tests. The results are shown in Tables 1 and 2.

Viscosity

The viscosity at 25° C. was measured using a BH-type rotational viscometer at a rotational speed of 4 rpm.

Shelf Stability

The resin composition was held at 25° C. and 60% RH. Shelf stability is expressed by a time which is one-half the time passed until the viscosity as measured above marked a 20% increase.

Gel Time

The gel time was determined by dropping 0.5 cc of the resin composition on a hot plate at 150° C., whipping the resin composition with a spatula, and monitoring the time when threading ceased.

Glass Transition Temperature (Tq)

Using a 5×5×15 mm dimensioned sample of the resin composition which had been cured at 120° C. for 0.5 hour and then at 165° C. for 3 hours, the glass transition temperature was measured with a thermomechanical analyzer at a heating rate of 5° C./min.

Coefficients of Thermal Expansion (CTE)

Based on the Tg measurement described above, a coefficient of thermal expansion below Tg (CTE-1) was determined for a temperature range of 50 to 80° C., and a coefficient of thermal expansion above Tg (CTE-2) was determined for a temperature range of 200 to 230° C.

PCT Peel Test

A polyimide-coated 10×10 mm silicon chip was mounted on a 30×30 mm FR-4 substrate with spacers of about 100 μm interposed therebetween. The epoxy resin composition was penetrated into the gaps and cured at 120° C. for 0.5 hour and then at 165° C. for 3 hours. The assembly was held at 30° C. and 65% RH for 192 hours and then processed 5 times by IR reflow set at a maximum temperature of 265° C., before the assembly was checked for peeling. The assembly was then placed in a PCT environment of 121° C. and 2.1 atm for 336 hours, before the assembly was checked for peeling. Peeling was inspected by C-SAM (SONIX Co., Ltd.).

Thermal Shock Test

A polyimide-coated 10×10 mm silicon chip was mounted on a 30×30 mm FR-4 substrate with spacers of about 100 μm interposed therebetween. The epoxy resin composition was penetrated into the gaps and cured at 120° C. for 0.5 hour and then at 165° C. for 3 hours. The assembly was held at 30° C. and 65% RH for 192 hours and then processed 5 times by IR reflow set at a maximum temperature of 265° C. The assembly was then tested by thermal cycling between −65° C./30 minutes and 150° C./30 minutes. After 250, 500, 750 and 1000 cycles, the assembly was examined for peeling (or delamination) and cracks.

Penetration Test

A pair of 30×70 mm glass plates were combined with spacers to define a gap of about 60 μm and heated at 120° C. The epoxy resin composition placed at one end of the gap penetrated through the gap. The composition was rated OK when it penetrated and reached a distance of at least 50 mm from the end and NG otherwise.

TABLE 1

| Formulation (pbw) | | Example | | | | Comparative Example | | |
|---|---|---|---|---|---|---|---|---|
| | | 1 | 2 | 3 | 4 | 1 | 2 | 3 |
| (A) | Epoxy resin (a) | 31.8 | 31.8 | 32.0 | 32.0 | 31.8 | 27.7 | 31.8 |
| | Epoxy resin (b) | 31.8 | 31.8 | 32.0 | 32.0 | 31.8 | 27.7 | 31.8 |
| (B) | Aromatic amine curing agent (A) | 33.0 | 33.0 | 30.1 | 30.1 | 33.0 | 20.8 | 33.0 |
| | Aromatic amine curing agent (B) | | | 3.3 | 3.3 | | | |
| | A/B equivalent ratio | 1.0 | 1.0 | 1.0 | 1.0 | 1.0 | 1.0 | 1.0 |
| (C) | Microcapsules of salicylic acid | 5.0 | 5.0 | 5.0 | 5.0 | | | |
| | Salicylic acid | | | | | 3.0 | 20.8 | |
| (D) | Inorganic filler (b) | 300.0 | 550.0 | 300.0 | 550.0 | 300.0 | 300.0 | 300.0 |
| Additives | Silane coupling agent | 1.5 | 1.5 | 1.5 | 1.5 | 1.5 | 1.5 | 1.5 |
| | Carbon black | 1.5 | 1.5 | 1.5 | 1.5 | 1.5 | 1.5 | 1.5 |
| | Copolymer | 4.0 | 4.0 | 4.0 | 4.0 | 4.0 | 4.0 | 4.0 |
| Viscosity @25° C. (Pa · s) | | 85 | 275 | 125 | 355 | 153 | 480 | 75 |
| Shelf stability (hr) | | 16 | 16 | 16 | 16 | 4 | 1 | 16 |
| Gel time (s) | | 27 | 23 | 22 | 30 | 28 | 15 | >600 |
| Tg (° C.) | | 155 | 157 | 152 | 155 | 151 | 149 | 150 |
| CTE-1 (ppm/° C.) | | 21 | 14 | 22 | 13 | 20 | 24 | 19 |
| CTE-2 (ppm/° C.) | | 65 | 50 | 60 | 52 | 63 | 58 | 60 |
| Peel test | After 5 times of IR reflow at 265° C. | no peeling | no peeling | no peeling | no peeling | no peeling | peeled | no peeling |
| | After PCT 336 hr | no peeling | no peeling | no peeling | no peeling | no peeling | no peeling | no peeling |
| Failure (%) after thermal shock test | 250 cycles | 0 | 0 | 0 | 0 | 0 | 0 | 0 |
| | 500 cycles | 0 | 0 | 0 | 0 | 0 | 0 | 0 |
| | 750 cycles | 0 | 0 | 0 | 0 | 0 | 20 | 0 |
| | 1000 cycles | 0 | 0 | 0 | 0 | 0 | 40 | 0 |

TABLE 2

| Formulation (pbw) | | Example | | | Comparative Example | | Reference Example | |
|---|---|---|---|---|---|---|---|---|
| | | 5 | 6 | 7 | 4 | 5 | 1 | 2 |
| (A) | Epoxy resin (a) | 34.0 | 32.5 | 35.0 | 34.0 | 34.0 | 34.0 | 34.0 |
| | Epoxy resin (b) | 34.0 | 32.5 | 35.0 | 34.0 | 34.0 | 34.0 | 34.0 |
| (B) | Curing agent (a) | 16.0 | | | 16.0 | 16.0 | 16.0 | 16.0 |
| | Curing agent (b) | | 17.5 | | | | | |
| | Curing agent (c) | | | 15.0 | | | | |
| | Aromatic amine curing agent (B) | 16.0 | 17.5 | 15.0 | 16.0 | 16.0 | 16.0 | 16.0 |
| | A/B equivalent ratio | 1.0 | 1.0 | 1.0 | 1.0 | 1.0 | 1.0 | 1.0 |
| (C) | Microcapsules of salicylic acid | 5.0 | 5.0 | 5.0 | | | 5.0 | 5.0 |
| | Salicylic acid | | | | | 20.8 | | |
| (D) | Inorganic filler (a) | 150.0 | 150.0 | 150.0 | 150.0 | 150.0 | | 550.0 |
| | Inorganic filler (b) | | | | | | 150.0 | |
| Additives | Silane coupling agent | 1.5 | 1.5 | 1.5 | 1.5 | 1.5 | 1.5 | 1.5 |
| | Carbon black | 1.5 | 1.5 | 1.5 | 1.5 | 1.5 | 1.5 | 1.5 |
| | Copolymer | 4.0 | 4.0 | 4.0 | 4.0 | 4.0 | 4.0 | 4.0 |
| Viscosity @25° C. (Pa · s) | | 28 | 25 | 32 | 25 | 40 | 17 | 645 |
| Shelf stability (hr) | | 16 | 16 | 16 | 16 | 2 | 16 | 16 |
| Gel time (s) | | 37 | 32 | 35 | >600 | 16 | 36 | 40 |
| Tg (° C.) | | 149 | 147 | 148 | 150 | 150 | 148 | 150 |
| CTE-1 (ppm/° C.) | | 33 | 31 | 29 | 33 | 29 | 35 | 15 |
| CTE-2 (ppm/° C.) | | 120 | 119 | 115 | 120 | 118 | 123 | 55 |
| Peel test | After 5 times of IR reflow at 265° C. | no peeling | no peeling | no peeling | no peeling | peeled | no peeling | not penetrated |
| | After PCT 336 hr | no peeling | no peeling | no peeling | no peeling | no peeling | no peeling | |
| Failure (%) after thermal shock test | 250 cycles | 0 | 0 | 0 | 0 | 0 | 0 | not penetrated |
| | 500 cycles | 0 | 0 | 0 | 0 | 0 | 0 | |
| | 750 cycles | 0 | 0 | 0 | 0 | 0 | 0 | |
| | 1000 cycles | 0 | 0 | 0 | 0 | 20 | 0 | |

15

(A) Liquid Epoxy Resin

Epoxy resin (a): bisphenol F epoxy resin
(RE303S-L, Nippon Kayaku Co., Ltd.)

Epoxy resin (b): trifunctional epoxy resin of the following formula (7)
(Epikote 630H, Japan Epoxy Resin Co., Ltd.)

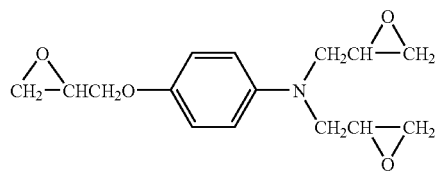

(7)

(B) Curing Agent

Aromatic amine curing agent (A): diethyldiaminodiphenylmethane
(Kayahard A-A, Nippon Kayaku Co., Ltd.)

Aromatic amine curing agent (B): tetraethyldiaminophenylmethane
(C-300S, Nippon Kayaku Co., Ltd.)

Curing agent (a): diethyltoluenediamine (Mw=178)

Curing agent (b): dimethylthiotoluenediamine (Mw=214.4)

Curing agent (c): dimethyltoluenediamine (Mw=150)

(C) Curing Catalyst

Microcapsules of salicylic acid: made of methyl methacrylate polymer containing 20% by weight of salicylic acid. Microcapsules have an average particle size of 7 μm. An amount of the catalyst leached out from the microcapsules with o-cresol at 30° C. for 15 minutes is 87 wt %.

(D) Inorganic Filler

Inorganic filler (a): spherical fused silica having an average particle size of 6 μm and a maximum particle size of 24 μm (Tatsumori Co., Ltd.)

Inorganic filler (b): spherical fused silica having an average particle size of 10 μm and a maximum particle size of 53 μm (Tatsumori Co., Ltd.)

Additives

Silane coupling agent:
γ-glycidoxypropyltrimethoxysilane
(KBM403, Shin-Etsu Chemical Co., Ltd.)

Carbon black: Denka Black (Denki Kagaku Kogyo K.K.)

Copolymer: copolymer prepared through addition reaction of SiH groups on SiH-containing organopolysiloxane having formula (8) and alkenyl groups on alkenyl-containing epoxy resin having formula (9), a content of organopolysiloxane being 81.5 wt %.

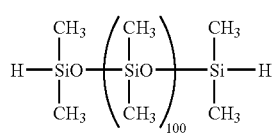

(8)

16

-continued

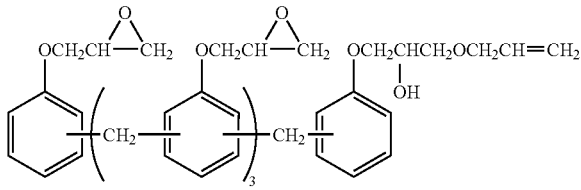

(9)

Japanese Patent Application No. 2005-087669 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A liquid epoxy resin potting composition comprising
   (A) a liquid epoxy resin, said liquid epoxy resin being liquid at 25° C.,
   (B) an aromatic amine curing agent, wherein the total amount of the aromatic amine curing agent is such that the ratio of the epoxy equivalent of the liquid epoxy resin to the amine equivalent of the aromatic amine curing agent is in the range from 0.7:1 to 1.2:1,
   (C) from 0.5 to 20 parts by weight per 100 parts by weight of components (A) and (B) combined of microcapsules containing a phenolic hydroxy-bearing benzoic acid derivative having the general formula (2):

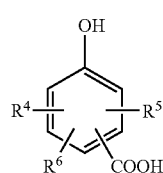

(2)

wherein $R^4$, $R^5$ and $R^6$ are each independently selected from the group consisting of hydrogen, hydroxyl, $C_1$-$C_{10}$ alkoxy, and substituted or unsubstituted monovalent $C_1$-$C_{12}$ hydrocarbon groups which may be separated by at least one atom selected from oxygen, nitrogen, sulfur and silicon, said microcapsules employing as their shell material a member selected from the group consisting of: polymers composed of (meth)acrylic monomers, polymers composed of monofunctional monomers, and polymers composed of polyfunctional monomers; said (meth)acrylic monomers selected from the group consisting of $C_1$-$C_8$ alkyl esters of acrylic acid, $C_1$-$C_8$ alkyl esters of methacrylic acid, $C_1$-$C_8$ alkyl esters of itaconic acid, $C_1$-$C_8$ alkyl esters of crotonic acid, and substituted derivatives thereof wherein the alkyl group is substituted with an allyl group; said monofunctional monomers selected from the group consisting of styrene, α-methylstyrene, acrylonitrile, methacrylonitrile, and vinyl acetate; and said polyfunctional monomers selected from the group consisting of ethylene glycol di(meth)

acrylate, polyethylene glycol di(meth)acrylate, divinyl-benzene, bisphenol A di(meth)acrylate, and methyl-enebis(meth)acrylamide, said phenolic hydroxyl-bearing benzoic acid derivative being enclosed within the polymer shell, wherein said microcapsules (C) have an average particle size of 0.5 to 10 μm, and wherein an amount of the phenolic hydroxy-bearing benzoic acid derivative leached out from said microcapsules with cresol at 30° C. for 15 minutes is at least 70% by weight of the total content of the phenolic hydroxy-bearing benzoic acid derivative in said microcapsules, and (D) 50 to 1,200 parts by weight per 100 parts by weight of epoxy resin (A) and aromatic amine curing agent (B) combined of an inorganic filler having an average particle size of 2 to 20 μm and a maximum particle size of up to 75 μm.

2. The composition of claim 1, wherein the phenolic hydroxy-bearing benzoic acid derivative having the general formula (2) is selected from the group consisting of salicylic acid, 3-hydroxybenzoic acid, 4-hydroxybenzoic acid, 3-methylsalicylic acid, 4-methylsalicylic acid, 5-methylsalicylic acid, 3,5-di-t-butyl-4-hydroxybenzoic acid, 2,3-dihydroxybenzoic acid, 2,4-dihydroxybenzoic acid, 2,5-dihydroxybenzoic acid, 2,6-dihydroxybenzoic acid, and octyl-4-hydroxybenzoic acid.

3. The composition of claim 1, wherein the liquid epoxy resin (A) comprises a bisphenol type epoxy resin, a naphthalene type epoxy resin, or a phenyl glycidyl ether, said liquid epoxy resin being liquid at 25° C.

4. The composition of claim 1, wherein the aromatic amine curing agent (B) comprises at least 5% by weight of an aromatic amine compound having the general formula (1):

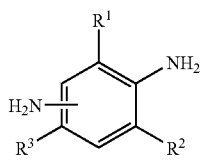

(1)

wherein $R^1$, $R^2$ and $R^3$ are each independently selected from the group consisting of monovalent $C_1$-$C_6$ hydrocarbon groups, $CH_3S$— and $C_2H_5S$—.

5. A semiconductor device encapsulated with a cured product of the liquid epoxy resin potting composition according to claim 1.

6. A liquid epoxy resin underfill composition comprising (A) a liquid epoxy resin, said liquid epoxy resin being liquid at 25° C., (B) an aromatic amine curing agent, wherein the total amount of the aromatic amine curing agent is such that the ratio of the epoxy equivalent of the liquid epoxy resin to the amine equivalent of the aromatic amine curing agent is in the range from 0.7:1 to 1.2:1, (C) from 0.5 to 20 parts by weight per 100 parts by weight of components (A) and (B) combined of microcapsules containing a phenolic hydroxyl-bearing benzoic acid derivative having the general formula (2):

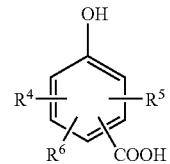

(2)

wherein $R^4$, $R^5$ and $R^6$ are each independently selected from the group consisting of hydrogen, hydroxyl, $C_1$-$C_{10}$ alkoxy, and substituted or unsubstituted monovalent $C_1$-$C_{12}$ hydrocarbon groups which may be separated by at least one atom selected from oxygen, nitrogen, sulfur and silicon, said microcapsules employing as their shell material a member selected from the group consisting of: polymers composed of (meth)acrylic monomers, polymers composed of monofunctional monomers, and polymers composed of polyfunctional monomers; said (meth)acrylic monomers selected from the group consisting of $C_1$-$C_8$ alkyl esters of acrylic acid, $C_1$-$C_8$ alkyl esters of methacrylic acid, $C_1$-$C_8$ alkyl esters of itaconic acid, $C_1$-$C_8$ alkyl esters of crotonic acid, and substituted derivatives thereof wherein the alkyl group is substituted with an allyl group; said monofunctional monomers selected from the group consisting of styrene, α-methylstyrene, acrylonitrile, methacrylonitrile, and vinyl acetate; and said polyfunctional monomers selected from the group consisting of ethylene glycol di(meth)acrylate, polyethylene glycol di(meth)acrylate, divinyl-benzene, bisphenol A di(meth)acrylate, and methyl-enebis(meth)acrylamide, said phenolic hydroxyl-bearing benzoic acid derivative being enclosed within the polymer shell, wherein said microcapsules (C) have an average particle size of 0.5 to 10 μm, and wherein an amount of the phenolic hydroxy-bearing benzoic acid derivative leached out from said microcapsules with cresol at 30° C. for 15 minutes is at least 70% by weight of the total content of the phenolic hydroxy-bearing benzoic acid derivative in said microcapsules, and (D) 50 to 400 parts by weight per 100 parts by weight of epoxy resin (A) and aromatic amine curing agent (B) combined of an inorganic filler having an average particle size at most about one-tenth as large and a maximum particle size at most one-half as large as the size of a flip chip gap between a substrate and semiconductor chip in a flip chip semiconductor device.

7. The composition of claim 6, wherein the phenolic hydroxy-bearing benzoic acid derivative having the general formula (2) is selected from the group consisting of salicylic acid, 3-hydroxybenzoic acid, 4-hydroxybenzoic acid, 3-methylsalicylic acid, 4-methylsalicylic acid, 5-methylsalicylic acid, 3,5-di-t-butyl-4-hydroxybenzoic acid, 2,3-dihydroxybenzoic acid, 2,4-dihydroxybenzoic acid, 2,5-dihydroxybenzoic acid, 2,6-dihydroxybenzoic acid, and octyl-4-hydroxybenzoic acid.

8. The composition of claim 6, wherein the liquid epoxy resin (A) comprises a bisphenol type epoxy resin, a naphthalene type epoxy resin, or a phenyl glycidyl ether, said liquid epoxy resin being liquid at 25° C.

9. The composition of claim 6, wherein the aromatic amine curing agent (B) comprises at least 5% by weight of an aromatic amine compound having the general formula (1):

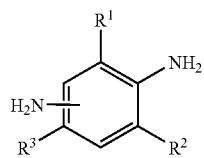

(1)

wherein $R^1$, $R^2$ and $R^3$ are each independently selected from the group consisting of monovalent $C_1$-$C_6$ hydrocarbon groups, $CH_3S$— and $C_2H_5S$—.

10. A flip-chip type semiconductor device encapsulated with a cured product of the liquid epoxy resin underfill composition according to claim 6.

* * * * *